United States Patent
Shin et al.

(10) Patent No.: US 7,898,228 B1
(45) Date of Patent: Mar. 1, 2011

(54) REVERSE RECOVERY CURRENT ASSISTED BODY-CONTROLLED SWITCH

(75) Inventors: Hyun-Ick Shin, Seoul (KR); Jae-Gon Seo, Kyunggi-do (KR); Sang-Yong Lee, Seoul (KR)

(73) Assignee: National Semiconductor Corporation, Santa Clara, CA (US)

( * ) Notice: Subject to any disclaimer, the term of this patent is extended or adjusted under 35 U.S.C. 154(b) by 661 days.

(21) Appl. No.: 11/754,137

(22) Filed: May 25, 2007

(51) Int. Cl.
*G05F 1/613* (2006.01)
*G05F 3/16* (2006.01)

(52) U.S. Cl. ...................... 323/223; 323/222

(58) Field of Classification Search ......... 323/222–225, 323/282
See application file for complete search history.

(56) References Cited

U.S. PATENT DOCUMENTS

| | | | |
|---|---|---|---|
| 5,180,964 A * | 1/1993 | Ewing | 323/222 |
| 5,410,467 A | 4/1995 | Smith et al. | 363/131 |
| 5,929,615 A * | 7/1999 | D'Angelo et al. | 323/224 |
| 6,434,019 B2 | 8/2002 | Baudelot et al. | 363/16 |
| 6,483,724 B1 | 11/2002 | Blair et al. | 363/17 |
| 7,148,668 B1 * | 12/2006 | Collins | 323/282 |

* cited by examiner

*Primary Examiner*—Harry Behm
*Assistant Examiner*—Matthew Grubb

(57) ABSTRACT

A synchronous switch uses body-control switches to control the polarity of the parasitic device, which can be used to reduce power consumption by the parasitic device in accordance with various operating conditions. A charge-supplying device (such as a capacitor) is coupled in series between the bulk node (of the synchronous switch) and a power node (such as Vout or ground). The charge-supplying device provides power to the bulk node of the switch during reverse recovery of the parasitic device to minimize recombination time. Minimizing recombination time allows the polarity of the parasitic device to be switched more quickly (especially under low operating voltage and/or heavy load conditions), which converses more power.

20 Claims, 3 Drawing Sheets

SHUTDOWN STATE (MP1:ON MP2:OFF)

OPERATING STATE (MP1:OFF MP2:ON)

REVERSE RECOVERY CURRENT ASSISTED BODY-CONTROLLED SWITCH

FIELD OF THE INVENTION

The present disclosure generally relates to electronic switches. More particularly, the present disclosure relates to body-controlled synchronous electronic switches.

BACKGROUND

Synchronous switching devices such as synchronous boost converters often use devices such as Schottky diodes or PMOS transistors as synchronous switches. Often, the devices form an intrinsic current path from an input (such as a battery) to an output (such as a load) even in "shutdown" conditions. The structures of the devices often form a parasitic Bipolar Junction Transistor (BJT), which can cause undesirable power consumption under various operating conditions. The power consumption can be a problem for heat-sensitive and/or power sensitive devices.

BRIEF DESCRIPTION OF THE DRAWINGS

Non-limiting and non-exhaustive embodiments are described with reference to the following drawings.

DETAILED DESCRIPTION

Figure 1:
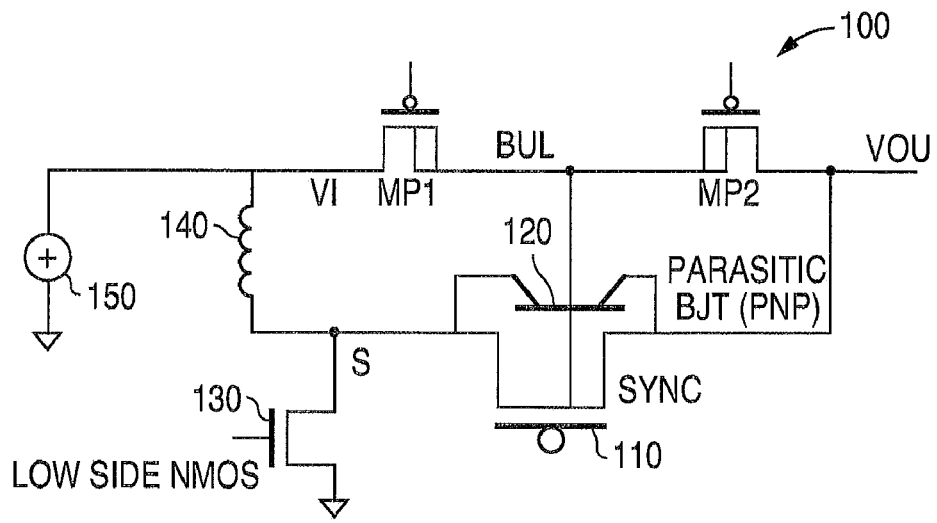
FIG. 1 is a schematic diagram illustrating a synchronous boost converter having a body-controlled switch for increasing the isolation between output and input.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electro-magnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity.

Briefly stated, the present disclosure generally relates to a synchronous switch wherein the structure of the switch forms a parasitic device having a bulk node. The synchronous switch has body-control switches to control the polarity of the parasitic device to reduce power consumption by the parasitic device in accordance with various operating conditions. A charge-supplying device (such as a capacitor) is coupled in series between the bulk node (of the synchronous switch) and a power node (such as Vout or ground). The charge-supplying device provides power to the bulk node of the switch during reverse recovery of the parasitic device to minimize recombination time. Minimizing recombination time allows the polarity of the parasitic device to be switched more quickly (especially under low operating voltages and/or heavy load conditions), which typically conserves more power.

FIG. 1 is a schematic diagram illustrating a synchronous boost converter having a body-controlled switch for increasing the isolation between output and input. Circuit 100 comprises a synchronous switch 110. Synchronous switch 110 is illustrative of a body-controlled synchronous switch that is disclosed in U.S. Pat. No. 7,148,668 (which is hereby incorporated by reference in its entirety). Power source 150 provides power to inductor 140 (for boosting the input voltage), which is controlled using (for example) a low side NMOS switch 130, and synchronous switch 110.

Synchronous switch 110 comprises a PMOS switch that normally forms an intrinsic parasitic device 120 such as a parasitic Bipolar Junction Transistor (BJT) of a PNP-type. The parasitic BJT usually comprises body diodes that can provide a current path from the input (such as node Vin) to the output (such as node Vout), which can waste power and generate heat.

Figure 2:
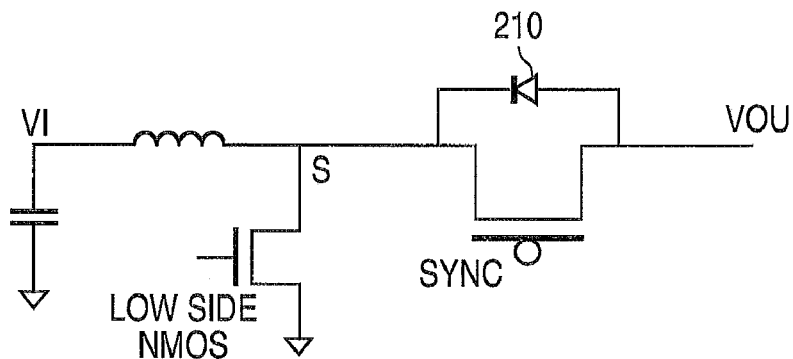
FIG. 2 is a schematic diagram illustrating the direction of a body diode 210 that is formed when the synchronous switch 110 is in a shutdown state.

The polarity of the parasitic BJT can be controlled by using switches MP1 and MP2. For example, FIG. 2 is a schematic diagram illustrating the direction of a body diode 210 that is fanned when the synchronous switch 110 is in a shutdown state. The synchronous switch 110 is in a shutdown state when switch MP1 is "on" and switch MP2 is "off."

Figure 3:
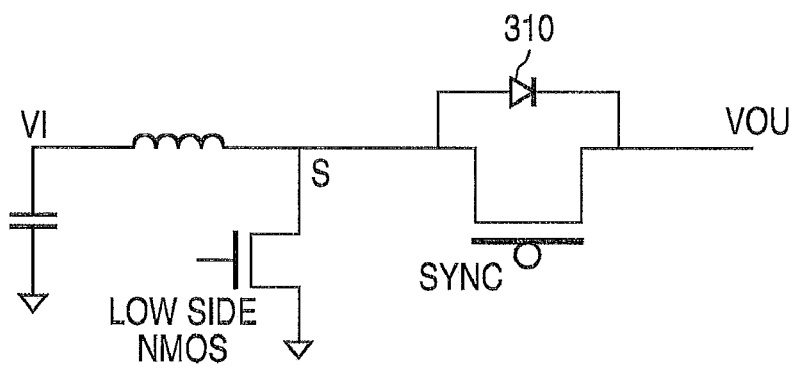
FIG. 3 is a schematic diagram illustrating the direction of a body diode 310 that is formed when the synchronous switch is in an operating state.

Similarly, FIG. 3 is a schematic diagram illustrating the direction of a body diode 310 that is formed when the synchronous switch is in an operating state. The synchronous switch 110 is in an operating state when switch MP1 is "off" and switch MP2 is "on." When the switch 110 is in an operating state (such as in a continuous current mode of operation), inductor current flows through the parasitic BJT (instead of synchronous switch) during a "dead time" to Vout. At the end of the dead time, (when the low side NMOS "on"), the parasitic BJT is reverse biased and the reverse recovery occurs. For example, a "dead time" is formed to avoid any shoot through from Vout to GND caused by on-time overlap of both low side NMOS and synchronous switch.

The reverse recovery current can be determined by several factors such as the slew rate (e.g., the dv/dt when the synchronous switch is "off" and the low side NMOS is "on"), inductor current, current density (as a function of the aspect ratio of the junction of the parasitic BJT), the recombination speed at base of the parasitic BJT, and the like.

In the example circuit, the speed of recombination at the base of the parasitic BJT is limited by switch MP2. The speed of recombination is limited because the drain-to-source resistance in the "on" condition (RDSOn) impedes carrier movement used for recombination in the base area. Thus, the body-controlled PMOS synchronous switches have substantially larger reverse recovery currents (which have even greater losses in efficiency at heavy loads) than conventional body source-shorted PMOS synchronous switches.

Some of the deficiencies of body-switched synchronous switches can be overcome by judiciously controlling the dead time. For example, turning on the NMOS switch 130 before the parasitic BJT device 120 is fully activated can be used to reduce various inefficiencies associated with the recombination time. However, control of the dead time can require sophisticated circuitry (having its own power requirements and/or space for components) to handle switch timing in accordance with various loads, supply voltages, and temperature.

Figure 4:
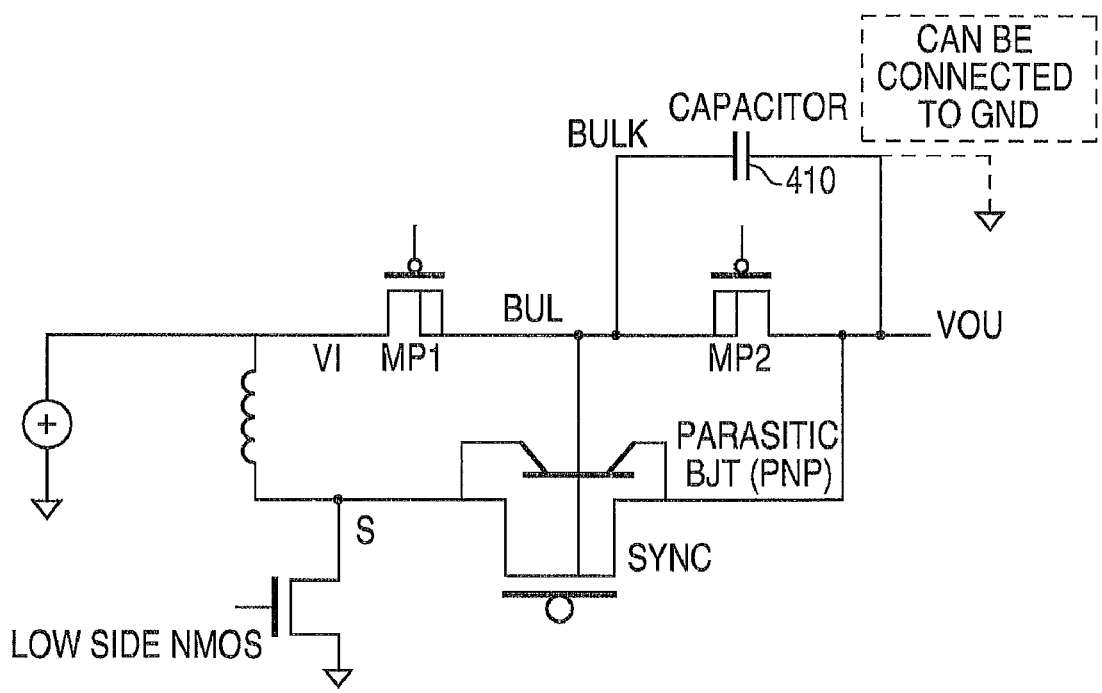
FIG. 4 is a schematic diagram illustrating a synchronous boost converter having a body controlled switch having charge storage for the bulk node of the body controlled switch.

FIG. 4 is a schematic diagram illustrating a synchronous boost converter having a body controlled switch having charge storage for the bulk node of the body controlled switch. Circuit 400 comprises synchronous switch 110 having a charge storage device 410 coupled between the bulk node of the parasitic BJT and a power node. The power node can be, for example, a positive or negative power supply node, or a node at ground potential (including "virtual" grounds).

For example, the body-controlled synchronous switch can include the body control switches and be provided as a module comprising pinouts (such as a component comprising leads) at nodes Vin, S, Bulk, and Vout. With standardized pinouts, the switch can be provided as an FET in, for example, a discrete, leaded package.

A charge storage device can be provided externally to the module by coupling the charge storage device between two nodes of the module, such as node Bulk and node Vout. In another example, the charge storage device can be provided externally to the module and coupled between node Bulk and a ground (potential with respect to the voltage at node Vin).

As introduced above, charge storage device 410 provides stored charge to node Bulk to assist in recombination of the parasitic BJT. When a capacitor is used as the charge storage device, alternating current can flow between the bulk node of the parasitic BJT and a node such as a power or ground node. Thus additional charge is provided across switch MP2 to assist in recombination of the parasitic BJT.

As discussed above, switch MP2 acts a barrier to recombination because the RDSOn provides a resistance that is typically substantially higher than a non-body-switched parasitic BJT. The increased charge supply thus works to help offset the additional resistance presented by the presence of the body-switch MP2, which works to impede the recombination of the base during the falling period of node SW.

The following description of the figures illustrates efficiencies of recovery current assisted body-controlled switches (as compared with non-recovery current assisted body-controlled switches) as determined by measurement. The measurements were performed using conditions of operating at room temperature, a voltage output of 18 volts, and an inductor of 10 µH.

The measurements reflect results of the circuit of FIG. 4, where a capacitor is coupled between the bulk node of the parasitic BJT and node Vout. The measurement results for the circuit of FIG. 4, where the capacitor is coupled between the bulk node of the parasitic BJT and ground, are similar to the measurements of the circuit where the capacitor is coupled between the bulk node of the parasitic BJT and node Vout.

Figure 5:
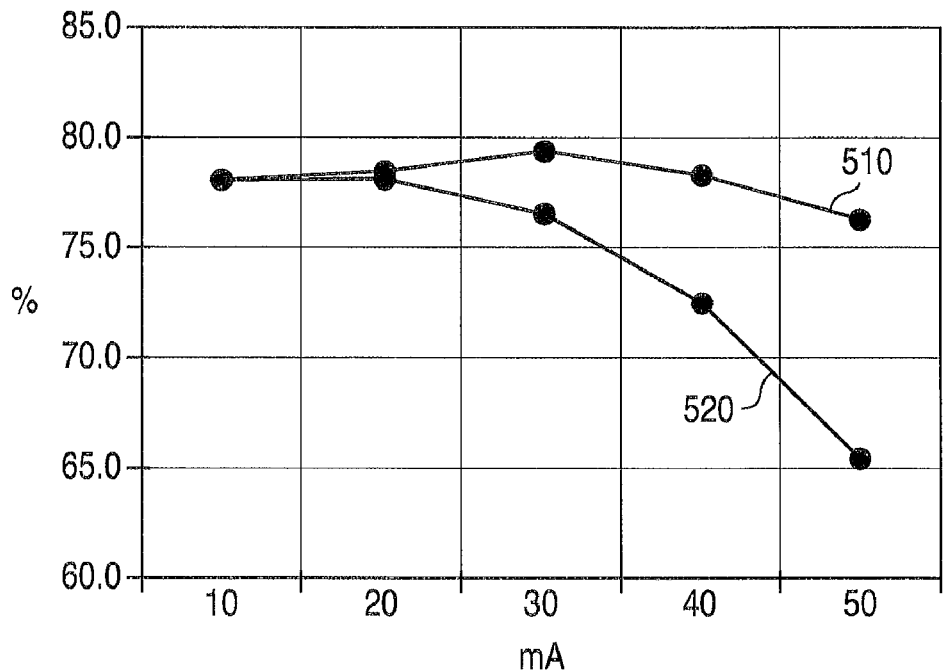
FIG. 5 is a graph illustrating the relative efficiencies at different current loads of a recovery current assisted body-controlled switch and a conventional body-controlled switch operating at 2.7 volts.

FIG. 5 is a graph illustrating the relative efficiencies at different current loads of a recovery current assisted body-controlled switch and a conventional body-controlled switch operating at 2.7 volts. The "X" dimension represents the load current of the output (Vout), whereas the "Y" dimension represents the efficiency of the switch as a percentage. Line 510 represents the efficiency curve of the recovery current assisted body-controlled switch, whereas line 520 represents the efficiency curve of the conventional body-controlled switch.

Thus, for example, line 510 demonstrates that an efficiency rating of about 77 percent is achieved at a load of about 50 milliamps for the recovery current assisted body-controlled switch. Line 520 demonstrates that a lesser efficiency rating of about 65 percent is achieved for the conventional body-controlled switch operating under similar conditions.

Figure 6:
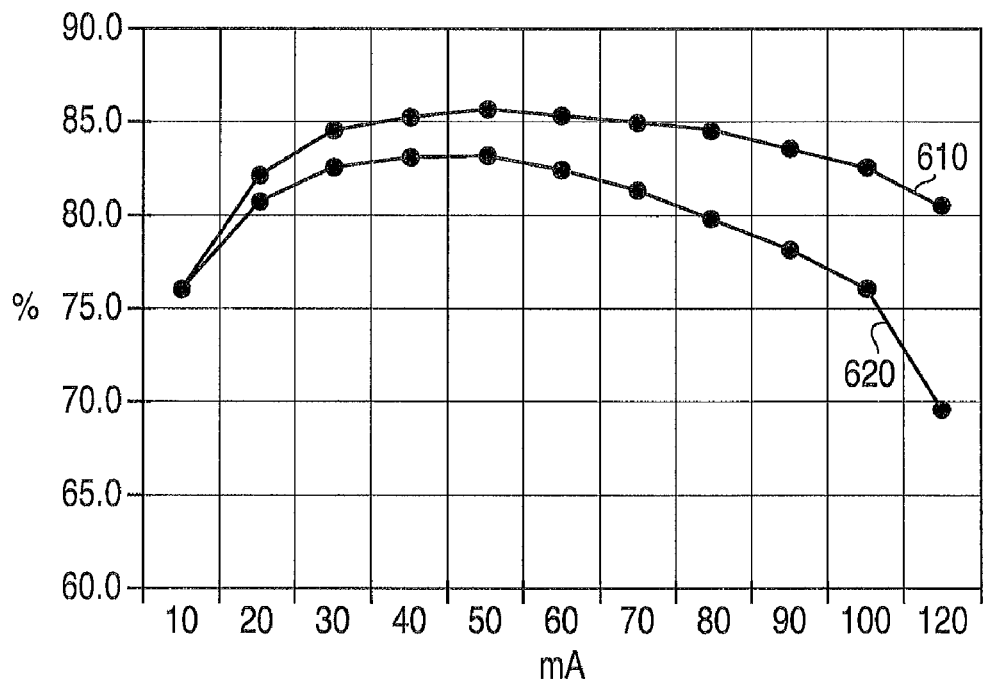
FIG. 6 is a graph illustrating the relative efficiencies at different current loads of a recovery current assisted body-controlled switch and a conventional body-controlled switch operating at 3.6 volts.

FIG. 6 is a graph illustrating the relative efficiencies at different current loads of a recovery current assisted body-controlled switch and a conventional body-controlled switch operating at 3.6 volts. Line 610 represents the efficiency curve of the recovery current assisted body-controlled switch, whereas line 620 represents the efficiency curve of the conventional body-controlled switch.

Thus, for example, line 610 demonstrates that an efficiency rating of about 80 percent is achieved at a load of about 120 milliamps for the recovery current assisted body-controlled switch. Line 620 demonstrates that a lesser efficiency rating of about 70 percent is achieved for the conventional body-controlled switch operating under similar conditions.

Figure 7:
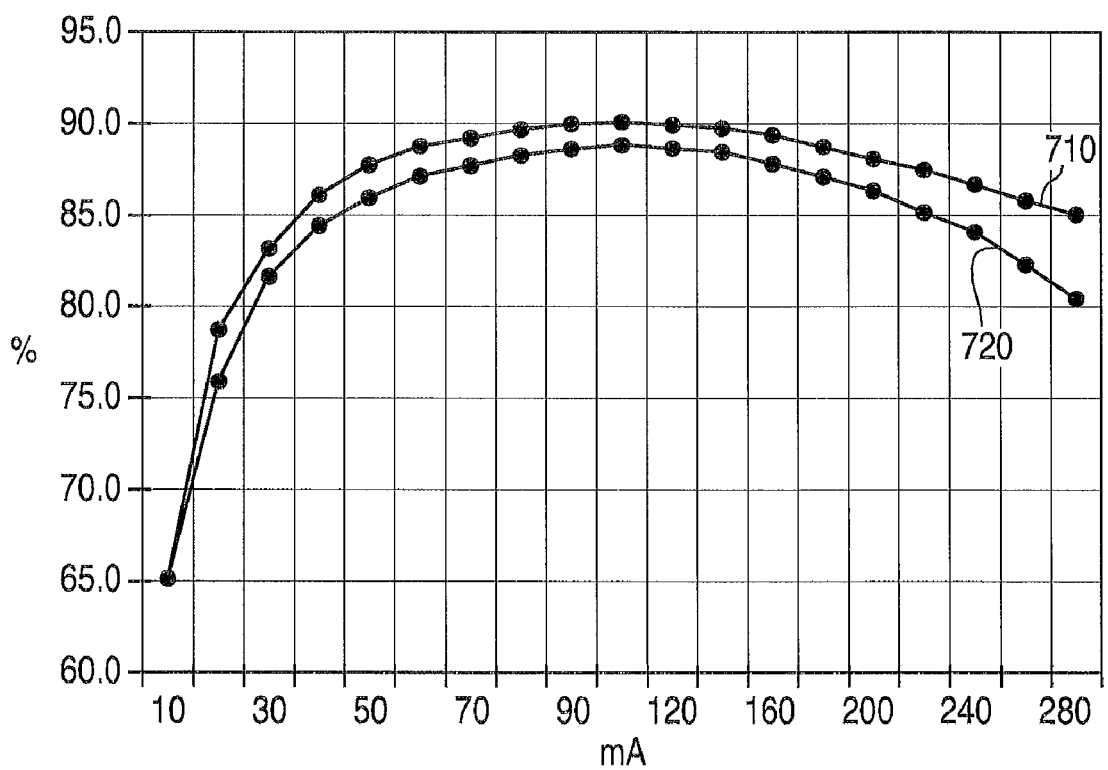
FIG. 7 is a graph illustrating the relative efficiencies at different current loads of a recovery current assisted body-controlled switch and a conventional body-controlled switch operating at 5 volts.

FIG. 7 is a graph illustrating the relative efficiencies at different current loads of a recovery current assisted body-controlled switch and a conventional body-controlled switch operating at 5.5 volts. Line 710 represents the efficiency curve of the recovery current assisted body-controlled switch, whereas line 720 represents the efficiency curve of the conventional body-controlled switch.

Thus, for example, an efficiency rating of line 710 demonstrates that an efficiency rating of about 86 percent is achieved at a load of 50 milliamps for the recovery current assisted body-controlled switch. Line 520 demonstrates that a lesser efficiency rating of about 81 percent is achieved for the conventional body-controlled switch operating under similar conditions.

It can be seen that the differential efficiencies between the two topologies increase with heavier loads and lower operating voltages. The addition of a capacitor (for example) to the bulk node of the parasitic body-controlled synchronous switch is a relatively simple way of enhancing the efficiencies of the switch. The enhanced efficiencies can allow, for example, increased maximum loads for devices being operated at ever-decreasing operating voltages.

Although the invention has been described herein by way of exemplary embodiments, variations in the structures and methods described herein may be made without departing from the spirit and scope of the invention. For example, the positioning and/or sizing of the various components may be varied. Individual components and arrangements of components may be substituted as known to the art. Since many embodiments of the invention can be made without departing from the spirit and scope of the invention, the invention is not limited except as by the appended claims.

What is claimed is:

1. A synchronous switch circuit, comprising:
a switch having a switch input node and a switch output node, wherein the switch comprises a parasitic bipolar junction transistor (BJT) having a first node coupled to the switch input node, a second node coupled to the switch output node, and a bulk node that is coupled to a charge storage device; and
a first body switch and a second body switch that are configured to (i) couple an anode of the BJT to the switch output node and a cathode of the BJT to the switch input node in a first operating mode and (ii) couple the cathode of the BJT to the switch output node and the anode of the BJT to the switch input node in a second operating mode;
wherein the charge storage device comprises a capacitor and is connected in parallel to the second body switch between the bulk node and the switch output node.

2. The circuit of claim 1, wherein:
the first operating mode comprises a shutdown state; and
the second operating mode comprises an operating state.

3. The circuit of claim 1, further comprising an NMOS switch coupled between the switch input node and a ground potential.

4. The circuit of claim 1, wherein the switch is embodied in a discrete package having leads for the switch input node, the switch output node, and the bulk node.

5. The circuit of claim 1, further comprising an inductor that is coupled between a power node and the switch input node.

6. The circuit of claim 5, further comprising a low-side switch having a drain coupled to the switch input node and a source coupled to a ground potential.

7. The circuit of claim 1, wherein the switch comprises a PMOS synchronous switch.

8. A method of reducing recombination time in a parasitic body device of a synchronous switch, comprising:
placing an input voltage on the body device in a first operating condition that is defined by the input voltage being greater than an output voltage;
placing the output voltage on the body device in a second operating condition that is defined by the input voltage being less than the output voltage; and
providing a charge to a bulk node of the body device via a charge storage device that is connected in parallel to a body switch between the bulk node and a power node of the synchronous switch, wherein the charge storage device comprises a capacitor.

9. The method of claim 8, wherein the power node is coupled to one of: the input voltage and the output voltage.

10. The method of claim 8, wherein:
the first operating condition comprises a shutdown state; and
the second operating condition comprises an operating state.

11. The method of claim 8, wherein the synchronous switch comprises a PMOS switch.

12. The method of claim 11, further comprising using an inductor to provide the input voltage.

13. The method of claim 12, further comprising coupling an NMOS switch between the input voltage and a ground potential.

14. A synchronous switch having a reduced recombination time of a parasitic body device of the synchronous switch, comprising:
means for placing an input voltage on the body device in a first operating condition that is defined by the input voltage being greater than an output voltage;
means for placing the output voltage on the body device in a second operating condition that is defined by the input voltage being less than the output voltage; and
means for providing an AC-coupled charge to a bulk node of the body device, wherein the means for providing comprises a charge storage device connected in parallel to a body switch between the bulk node and an output node of the synchronous switch, and wherein the charge storage device comprises a capacitor.

15. The synchronous switch of claim 14, further comprising means for boosting the input voltage.

16. The synchronous switch of claim 14, wherein the synchronous switch is implemented inside a monolithic integrated circuit.

17. The synchronous switch of claim 14, wherein the synchronous switch is embodied in a discrete package having leads for the bulk node and the output node of the synchronous switch.

18. The method of claim 8, wherein the synchronous switch is embodied in a discrete package having leads for the bulk node and the power node of the synchronous switch.

19. The synchronous switch of claim 18, wherein:
the first operating condition comprises a shutdown state; and
the second operating condition comprises an operating state.

20. The synchronous switch circuit of claim 1, wherein the synchronous switch is implemented inside a monolithic integrated circuit.

* * * * *